(12) United States Patent
Lee et al.

(10) Patent No.: US 12,507,555 B2
(45) Date of Patent: Dec. 23, 2025

(54) DISPLAY DEVICE AND METHOD OF MANUFACTURING THE DISPLAY DEVICE

(71) Applicant: Samsung Display Co., Ltd., Yongin-si (KR)

(72) Inventors: Dongmin Lee, Yongin-si (KR);
Hyuneok Shin, Yongin-si (KR);
Joonyong Park, Yongin-si (KR);
Sukyoung Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 447 days.

(21) Appl. No.: 18/192,618

(22) Filed: Mar. 29, 2023

(65) Prior Publication Data

US 2024/0081118 A1    Mar. 7, 2024

(30) Foreign Application Priority Data

Sep. 6, 2022    (KR) ........................ 10-2022-0112986

(51) Int. Cl.
*H10K 59/131*      (2023.01)
*H10K 59/12*      (2023.01)
*H10K 71/00*      (2023.01)

(52) U.S. Cl.
CPC ..... *H10K 59/1315* (2023.02); *H10K 59/1201* (2023.02); *H10K 71/00* (2023.02)

(58) Field of Classification Search
CPC ........... H10K 59/1315; H10K 59/1201; H10K 71/00; H10K 71/40; H10K 59/12;
(Continued)

(56) References Cited

U.S. PATENT DOCUMENTS

| 5,373,275 A | 12/1994 | Itoh et al. |
| 6,624,473 B1 * | 9/2003 | Takehashi .......... H10D 30/6739 |
| | | 257/E21.414 |

(Continued)

FOREIGN PATENT DOCUMENTS

| CN | 111834466 A | 10/2020 |
| JP | 1994-082949 B2 | 10/1994 |

(Continued)

OTHER PUBLICATIONS

Chen, Guoliang, et al. "Oxidation and mechanical behavior of intermetallic alloys in the Ti—Nb—Al ternary system." High Temperature Aluminides and Intermetallics, 1992, pp. 597-601, https://doi.org/10.1016/b978-1-85166-822-9.50094-7. (Year: 1992).*

(Continued)

*Primary Examiner* — J. E. Schoenholtz
(74) *Attorney, Agent, or Firm* — Womble Bond Dickinson (US) LLP

(57) ABSTRACT

A display device includes: a wiring line on a first inorganic insulating layer; a second inorganic insulating layer covering the wiring line; and a display element on the second inorganic insulating layer, wherein the wiring line includes: a lower layer including at least one of aluminum (Al) or an aluminum (Al) alloy; an upper layer on the lower layer and including a niobium titanium ($Nb_xTi_y$) alloy; and an intermediate layer arranged between the lower layer and the upper layer and including at least one of a niobium titanium aluminum ($Nb_xTi_yAl_z$) alloy or a titanium aluminum ($Ti_xAl_y$) alloy.

20 Claims, 11 Drawing Sheets

(58) Field of Classification Search
CPC .. H10K 59/131; H10K 59/124; H10K 71/231; H10K 2102/351; H10D 86/021; H10D 86/60; H10D 86/441; H10H 20/01; H10H 29/142

See application file for complete search history.

(56) References Cited

U.S. PATENT DOCUMENTS

| | | | |
|---|---|---|---|
| 11,367,742 B2* | 6/2022 | Shin | H10D 86/411 |
| 12,349,572 B2* | 7/2025 | Lee | H10K 59/1315 |
| 2020/0119058 A1* | 4/2020 | Shin | H10D 86/60 |
| 2021/0280666 A1 | 9/2021 | Sohn et al. | |
| 2023/0047134 A1* | 2/2023 | Lee | H10K 71/00 |

FOREIGN PATENT DOCUMENTS

| | | |
|---|---|---|
| KR | 10-1931337 B1 | 3/2019 |
| KR | 10-2020-0001653 A | 1/2020 |
| KR | 10-2020-0042971 A | 4/2020 |

OTHER PUBLICATIONS

Liu, Z.C., et al. "Effects of Nb and al on the microstructures and mechanical properties of high Nb Containing TiAl Base Alloys." Intermetallics, vol. 10, No. 7, Jul. 2002, pp. 653-659, https://doi.org/10.1016/s0966-9795(02)00037-7. (Year: 2002).*

* cited by examiner

FIG. 7

| CASE | I | II | III |
|---|---|---|---|
| HEAT TREATMENT | X | O | O |
| UPPER LAYER | NbTi | TiN | NbTi |
| LOW LAYER | Al | Al | Al |
| IMAGE | | | |
| THERMAL CORROSION | OCCURRENCE | OCCURRENCE | NON-OCCURRENCE |

DISPLAY DEVICE AND METHOD OF MANUFACTURING THE DISPLAY DEVICE

CROSS-REFERENCE TO RELATED APPLICATION

The present application claims priority to and the benefit of Korean Patent Application No. 10-2022-0112986, filed on Sep. 6, 2022, in the Korean Intellectual Property Office, the disclosure of which is incorporated by reference herein in its entirety.

BACKGROUND

1. Field

Aspects of some embodiments relate to a display device including a wiring line having low resistance and increased reliability, and a method of manufacturing the display device.

2. Description of the Related Art

Display devices visually display data. Display devices are used, for example, as displays for display images on small products, such as mobile phones, and as displays of large products, such as televisions.

A display device may include a plurality of sub-pixels that emit light by receiving an electrical signal to display an image to the outside, and each of the plurality of sub-pixels may include a display element. Recently, the demand for high-resolution and high-density circuits and the demand for display devices using wiring lines having low resistance and high reliability have increased.

The above information disclosed in this Background section is only for enhancement of understanding of the background and therefore the information discussed in this Background section does not necessarily constitute prior art.

SUMMARY

One or more embodiments include a display device including a wiring line that includes at least one of aluminum (Al) or an Al alloy and thus has low resistance, prevents or reduces thermal corrosion, and prevents or reduces damage caused by a cleaning solution or an etchant.

One or more embodiments include a method of manufacturing the display device.

Additional aspects will be set forth in part in the description which follows and, in part, will be apparent from the description, or may be learned by practice of the presented embodiments of the disclosure.

According to one or more embodiments, a display device includes a first inorganic insulating layer, a wiring line on the first inorganic insulating layer, a second inorganic insulating layer covering the wiring line, and a display element on the second inorganic insulating layer, wherein the wiring line includes a lower layer including at least one of aluminum (Al) or an aluminum (Al) alloy, an upper layer on the lower layer and including a niobium titanium ($Nb_xTi_y$) alloy, and an intermediate layer arranged between the lower layer and the upper layer and including at least one of a niobium titanium aluminum ($Nb_xTi_y Al_z$) alloy or a titanium aluminum ($Ti_xAl_y$) alloy.

According to some embodiments, in the niobium titanium ($Nb_xTi_y$) alloy of the upper layer, an amount of titanium (Ti) is in a range of 5 at % or more and 50 at % or less.

According to some embodiments, a thickness of the upper layer may be in a range of 30 Å or more and 1000 Å or less.

According to some embodiments, the upper layer may include a first upper layer on the intermediate layer and a second upper layer on the first upper layer, wherein the first upper layer may include titanium (Ti), and the second upper layer may include a niobium titanium ($Nb_xTi_y$) alloy.

According to some embodiments, the intermediate layer may include a titanium aluminum ($Ti_xAl_y$) alloy.

According to some embodiments, a thickness of the first upper layer may be less than a thickness of the second upper layer.

According to some embodiments, a thickness of the second upper layer may be in a range of 30 Å or more and 1000 Å or less.

According to some embodiments, the wiring line may further include an oxide layer on a side surface of the lower layer, a side surface of the intermediate layer, and a side surface and an upper surface of the upper layer.

According to some embodiments, a thickness of the oxide layer may be in a range of about 10 nm to about 40 nm.

According to some embodiments, the aluminum (Al) alloy may include at least one of nickel (Ni), lanthanum (La), neodymium (Nd), or germanium (Ge).

According to some embodiments, in the aluminum (Al) alloy, an amount of at least one of nickel (Ni), lanthanum (La), neodymium (Nd), or germanium (Ge) may be in a range of about 0.01 at % to about 2 at %.

According to some embodiments, in the aluminum (Al) alloy, an amount of nickel (Ni) may be in a range of about 0.01 at % to about 0.05 at %, and an amount of lanthanum (La) may be in a range of about 0.01 at % to about 0.1 at %.

According to one or more embodiments, a method of manufacturing a display device includes preparing a lower conductive layer on a first inorganic insulating layer and including at least one of aluminum (Al) or an aluminum (Al) alloy, and an upper conductive layer on the lower conductive layer and including a niobium titanium (NbTi) alloy, dry-etching a portion of the lower conductive layer and a portion of the upper conductive layer to provide a lower layer and an upper layer on the lower layer, and forming, between the lower layer and the upper layer, an intermediate layer including at least one of a niobium titanium aluminum ($Nb_xTi_yAl_z$) alloy or a titanium aluminum ($Ti_xAl_y$) alloy by performing a heat treatment of the lower layer and the upper layer.

According to some embodiments, the dry-etching of the portion of the lower conductive layer and the portion of the upper conductive layer may include forming a photoresist pattern on the upper conductive layer, dry-etching the portion of the lower conductive layer and the portion of the upper conductive layer by using the photoresist pattern as a mask, and removing the photoresist pattern.

According to some embodiments, in the niobium titanium ($Nb_xTi_y$) alloy of the upper layer, an amount of titanium (Ti) may be in a range of 5 at % or more and 50 at % or less.

According to some embodiments, the upper conductive layer may include a plurality of layers, and includes a layer including a niobium titanium ($Nb_xTi_y$) alloy and a titanium (Ti) layer between the lower conductive layer and the layer including the niobium titanium ($Nb_xTi_y$) alloy, and the upper layer may include a first upper layer including titanium (Ti) and a second upper layer on the first upper layer and including a niobium titanium ($Nb_xTi_y$) alloy.

According to some embodiments, the intermediate layer may include a titanium aluminum ($Ti_xAl_y$) alloy.

According to some embodiments, the forming of the intermediate layer may include generating inter-diffusion between the lower layer and the upper layer.

According to some embodiments, the heat treatment may be performed at about 350° C. to about 500° C.

According to some embodiments, the forming of the intermediate layer may include forming an oxide layer covering a side surface of each of the lower layer, the intermediate layer, and the upper layer and at least a portion of an upper surface of the upper layer.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 7 is a table showing corrosion of a wiring line by heat depending on the material of a lower layer, the material of an upper layer, and whether or not heat treatment is performed.

DETAILED DESCRIPTION

Figure 1:
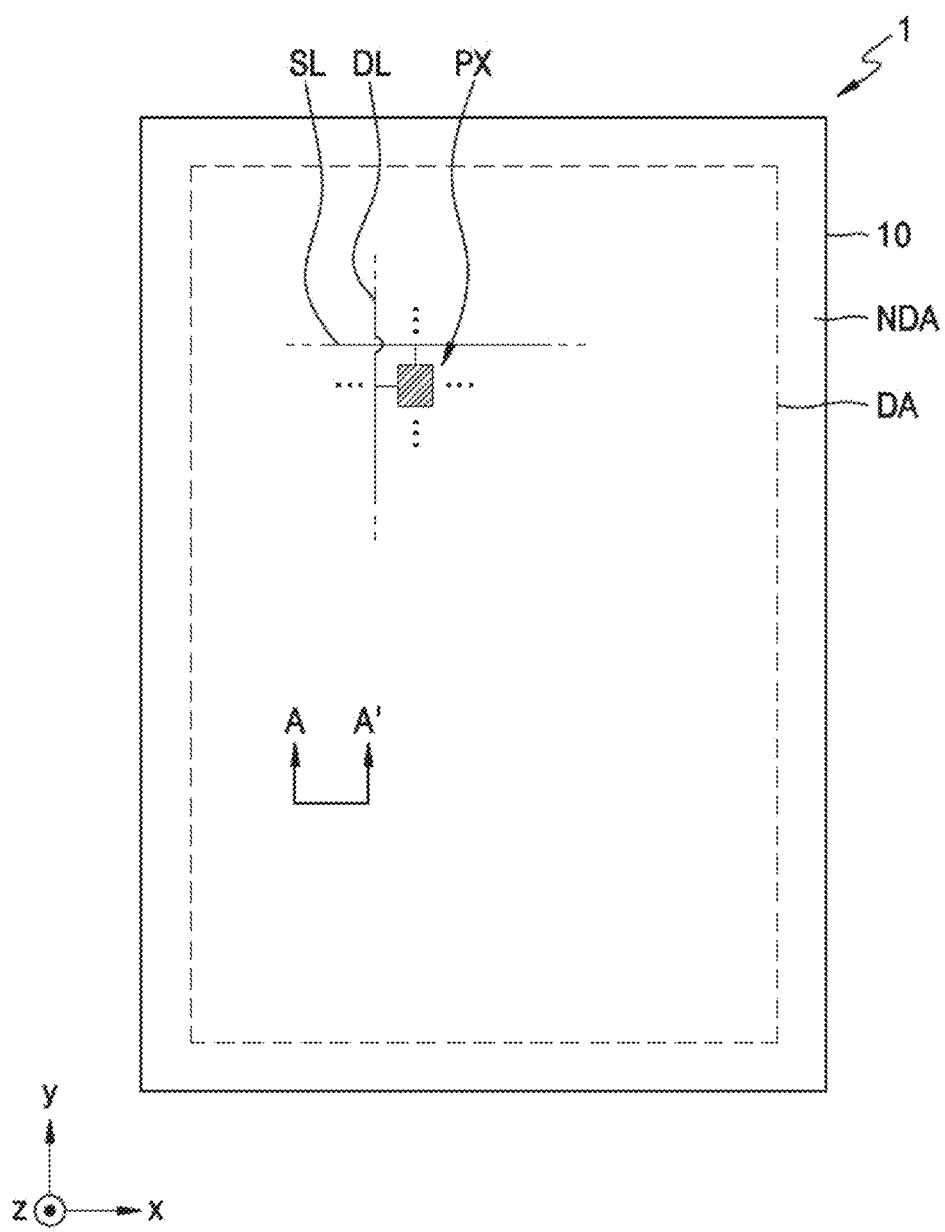
FIG. 1 is a schematic plan view of a display device according to an embodiment.

Reference will now be made in detail to embodiments, examples of which are illustrated in the accompanying drawings, wherein like reference numerals refer to like elements throughout the disclosure. In this regard, the present embodiments may have different forms and configurations and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any variations thereof.

The disclosure may include various embodiments and modifications, and embodiments thereof will be illustrated in the drawings and will be described herein in detail. The effects and features of the disclosure and the accompanying methods thereof will become apparent from the following description of the embodiments, taken in conjunction with the accompanying drawings. However, the disclosure is not limited to the embodiments described below, and may be embodied in various modes.

Hereinafter, the disclosure will be described in detail by explaining embodiments of the disclosure with reference to the attached drawings. Like reference numerals in the drawings denote like elements, and redundant explanations are omitted.

In the embodiments below, it will be understood that although the terms "first," "second," etc. may be used herein to describe various elements, these elements should not be limited by these terms. These elements are only used to distinguish one component from another component.

As used herein, the singular forms "a," "an," and "the" are intended to include the plural forms as well, unless the context clearly indicates otherwise.

In the embodiments below, it will be understood that the terms "comprises" and/or "comprising" used herein specify the presence of stated features or elements, but do not preclude the presence or addition of one or more other features or elements.

It will be further understood that a layer, region, or element that is "formed on" another layer, area, or element may be directly or indirectly formed on the other layer, region, or element. That is, for example, intervening layers, regions, or elements may be present therebetween.

Sizes of elements in the drawings may be exaggerated or contracted for convenience of explanation. In other words, because sizes and thicknesses of elements in the drawings are arbitrarily illustrated for convenience of explanation, the following embodiments are not limited thereto.

When an embodiment may be implemented differently, a process order may be performed differently from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, region, or element is referred to as being "electrically connected to" or "electrically coupled to" another layer, region, or element, it may be directly or indirectly electrically connected or coupled to the other layer, region, or element. That is, for example, intervening layers, regions, or elements may be present therebetween.

FIG. 1 is a schematic plan view of a display device 1 according to some embodiments. According to some embodiments, the display device 1 may include a substrate 10, a sub-pixel PX, a scan line SL, and a data line DL.

The substrate 10 may include a display area DA and a non-display area NDA. The display area DA may be an area in which the display device 1 displays an image. Accordingly, the sub-pixel PX may be arranged in the display area DA. The non-display area NDA may be an area in which the display device 1 does not display an image. A driving circuit and/or power line of the display device 1 may be arranged in the non-display area NDA. According to some embodiments, the non-display area NDA may at least partially surround the display area DA. For example, the non-display area NDA may completely surround the display area DA.

The sub-pixel PX may be arranged in the display area DA. The sub-pixel PX may emit light. According to some embodiments, a plurality of sub-pixels PX may be provided, and the display device 1 may display an image by using light emitted from the plurality of sub-pixels PX.

The sub-pixel PX may be electrically connected to a scan line SL configured to transmit a scan signal and a data line DL configured to transmit a data signal. The sub-pixel PX may receive the scan signal and the data signal to emit light.

The scan line SL may transmit a scan signal. According to some embodiments, the scan line SL may extend in a first direction (e.g., an x-direction or a −x-direction). The scan line SL may be electrically connected to the sub-pixel PX. According to some embodiments, the scan line SL may receive a scan signal from a driving circuit.

The data line DL may transmit a data signal. According to some embodiments, the data line DL may extend in a second direction (e.g., a y-direction or a −y-direction). The data line DL may be electrically connected to the sub-pixel PX.

Figure 2:
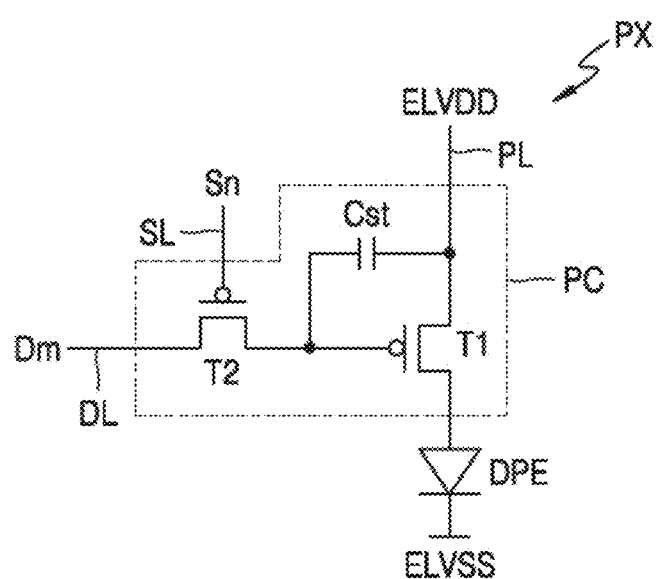
FIG. 2 is an equivalent circuit diagram of a sub-pixel of a display device according to an embodiment.

FIG. 2 is an equivalent circuit diagram of a sub-pixel PX of a display device 1 according to some embodiments.

Referring to FIG. 2, the sub-pixel PX may include a pixel circuit PC and a display element DPE electrically connected to the pixel circuit PC. The pixel circuit PC may include a driving thin-film transistor T1, a switching thin-film transistor T2, and a storage capacitor Cst. For example, the sub-pixel PX may emit, through the display element DPE, one of red light, green light, or blue light or one of red light, green light, blue light, and white light.

The switching thin-film transistor T2 may be connected to a scan line SL and a data line DL and may be configured to transmit a data voltage or a data signal Dm received via the data line DL to the driving thin-film transistor T1 according to a scan voltage or a scan signal Sn received via the scan line SL.

The storage capacitor Cst may be connected to the switching thin-film transistor T2 and a driving voltage line PL and may store a voltage difference between a voltage received from the switching thin-film transistor T2 and a first power voltage ELVDD applied to the driving voltage line PL.

The driving thin-film transistor T1 may be connected to the driving voltage line PL and the storage capacitor Cst and may be configured to control a driving current flowing to the display element DPE from the driving voltage line PL according to the voltage stored in the storage capacitor Cst. The display element DPE may emit light having a certain luminance according to the driving current. An opposite electrode (e.g., a cathode) of the display element DPE may be configured to receive a second power voltage ELVSS.

FIG. 2 illustrates that the pixel circuit PC includes two thin-film transistors and one storage capacitor, but according to some embodiments, the pixel circuit PC may include three or more thin-film transistors.

According to some embodiments, the display element DPE may be an organic light-emitting diode including an organic emission layer. Alternatively, the display element DPE may be a light-emitting diode. The size of the light-emitting diode may be on a micro scale or a nano scale. For example, the light-emitting diode may be a micro light-emitting diode. Alternatively, the light-emitting diode may be a nanorod light-emitting diode. The nanorod light-emitting diode may include gallium nitride (GaN). According to some embodiments, a color conversion layer may be located on the nanorod light-emitting diode. The color conversion layer may include quantum dots. Alternatively, the display element DPE may be a quantum dot light-emitting diode including a quantum dot emission layer. Alternatively, the display element DPE may be an inorganic light-emitting diode including an inorganic semiconductor.

Figure 3:
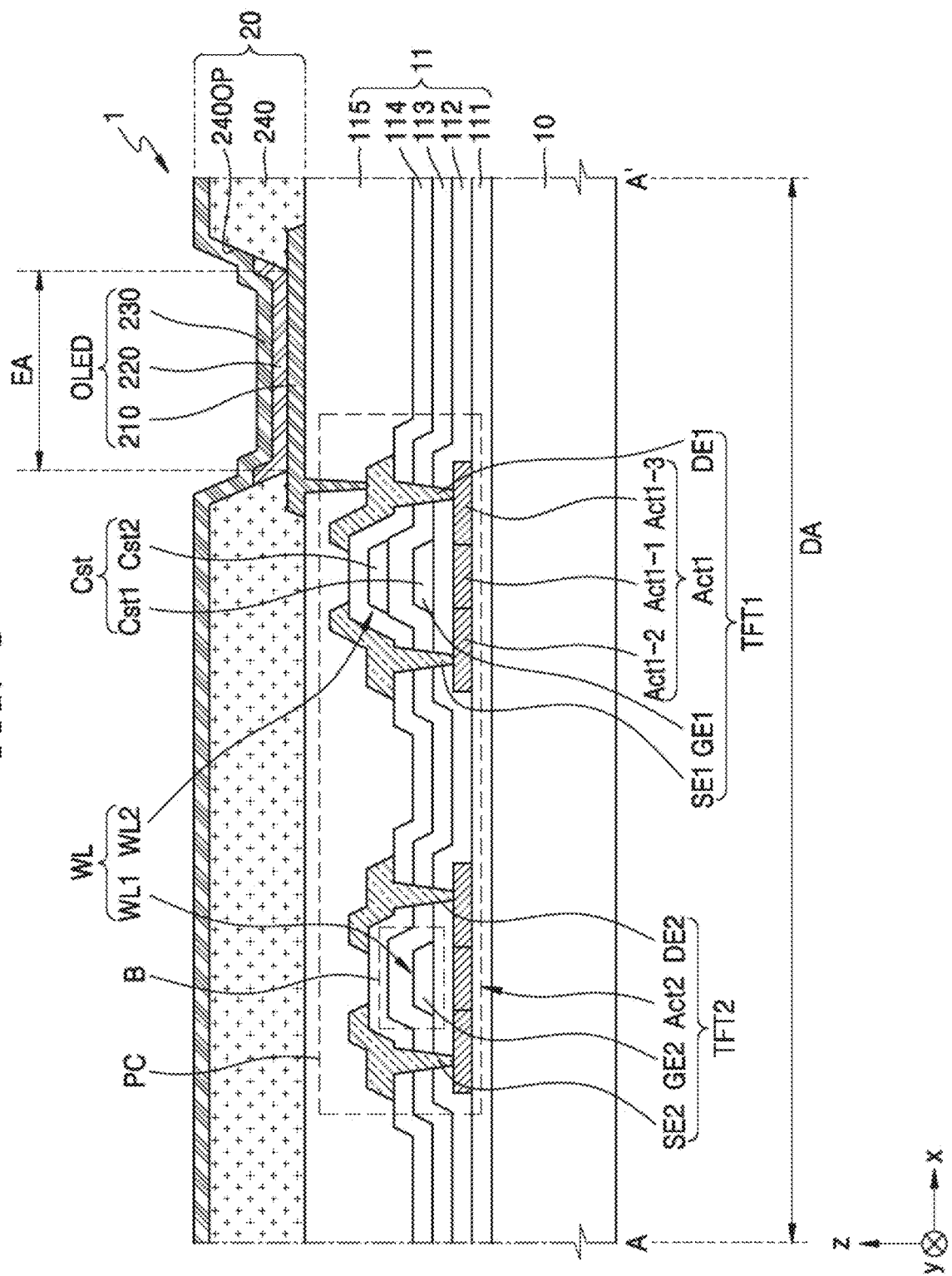
FIG. 3 is a schematic cross-sectional view of the display device of FIG. 1 taken along the line A-A'.

FIG. 3 is a schematic cross-sectional view of the display device 1 of FIG. 1 taken along the line A-A'.

Referring to FIG. 3, the display device 1 may include a substrate 10, a pixel circuit layer 11, and a display element layer 20. The pixel circuit layer 11 and the display element layer 20 may be sequentially located on the substrate 10.

The substrate 10 may include a display area DA. According to some embodiments, the substrate 10 may include glass. According to some embodiments, the substrate 10 may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. According to some embodiments, the substrate 10 may have a multi-layered structure including a base layer and a barrier layer, which include the aforementioned polymer resin.

A barrier layer may be further included between the pixel circuit layer 11 and the substrate 10. The barrier layer may prevent the penetration of foreign materials and may be a single layer or multilayer including an inorganic material, such as silicon nitride ($SiN_x$) or silicon oxide ($SiO_2$).

The pixel circuit layer 11 may be located on the substrate 10. The pixel circuit layer 11 may include a pixel circuit PC and a buffer layer 111, a first inorganic insulating layer 112, a second inorganic insulating layer 113, a third inorganic insulating layer 114, and an organic insulating layer 115, which are located below and/or above components of the pixel circuit PC. According to some embodiments, the pixel circuit layer 11 may include a wiring line WL. The pixel circuit PC may include a first thin-film transistor TFT1, a second thin-film transistor TFT2, and a storage capacitor Cst. According to some embodiments, the first thin-film transistor TFT1 may be the driving thin-film transistor of FIG. 2. According to some embodiments, the second thin-film transistor TFT2 may be the switching thin-film transistor of FIG. 2.

The buffer layer 111 may be located on the substrate 10. The buffer layer 111 may include an inorganic insulating material, such as $SiN_x$, silicon oxynitride (SiON), and $SiO_2$, and may be a single layer or multilayer including the aforementioned inorganic insulating material.

The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. Because the second semiconductor layer Act2, the second gate electrode GE2, the second source electrode SE2, and the second drain electrode DE2 are respectively similar to the first semiconductor layer Act12, the first gate electrode GE1, the first source electrode SE1, and the first drain electrode DE1, detailed descriptions thereof are omitted.

The first semiconductor layer Act1 may be located on the buffer layer 111. The first semiconductor layer Act1 may include polysilicon. Alternatively, the first semiconductor layer Act1 may include amorphous silicon, an oxide semiconductor, or an organic semiconductor. According to some embodiments, the first semiconductor layer Act1 may include a channel region Act1-1, and a source region Act1-2 and a drain region Act1-3 located on both sides of the channel region Act1-1, respectively. The first gate electrode GE1 may overlap the channel region Act1-1 of the first semiconductor layer Act1. The first gate electrode GE1 may include a low-resistance metal material.

The first inorganic insulating layer 112 may be arranged between the first semiconductor layer Act1 and the first gate electrode GE1. The first inorganic insulating layer 112 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), or zinc oxide (ZnO).

The second inorganic insulating layer 113 may cover the first gate electrode GE1. Similar to the first inorganic insulating layer 112, the second inorganic insulating layer 113 may include an inorganic insulating material, such as $SiO_2$, $SiN_x$, SiON, $Al_2O_3$, $TiO_2$, $Ta_2O_5$, $HfO_2$, or ZnO.

An upper electrode Cst2 of the storage capacitor Cst may be located on the second inorganic insulating layer 113.

According to some embodiments, the upper electrode Cst2 may overlap the first gate electrode GE1. In this case, the first gate electrode GE1 and the upper electrode Cst2 overlapping each other with the second inorganic insulating layer 113 therebetween may constitute the storage capacitor Cst. In other words, the first gate electrode GE1 may function as a lower electrode Cst1 of the storage capacitor Cst. As described above, the storage capacitor Cst and the first thin-film transistor TFT1 may overlap each other. According to some embodiments, the storage capacitor Cst and the first thin-film transistor TFT1 may not overlap each other. According to some embodiments, the storage capacitor Cst and the second thin-film transistor TFT2 may not overlap each other.

The third inorganic insulating layer 114 may cover the upper electrode Cst2. The third inorganic insulating layer 114 may include $SiO_2$, $SiN_x$, SiON, $Al_2O_3$, $TiO_2$, $Ta_2O_5$, $HfO_2$, ZnO, or the like. The third inorganic insulating layer 114 may be a single layer or multilayer including the aforementioned inorganic insulating material.

The first source electrode SE1 and the first drain electrode DE1 may each be located on the third inorganic insulating layer 114. At least one of the first source electrode SE1 or the first drain electrode DE1 may include a material having good conductivity. At least one of the first source electrode SE1 or the first drain electrode DE1 may include a conductive material including molybdenum (Mo), aluminum (Al), copper (Cu), titanium (Ti), or the like and may be provided as a multilayer or single layer including the conductive material. According to some embodiments, at least one of the first source electrode SE1 or the first drain electrode DE1 may have a multi-layered structure including Ti/Al/Ti layers.

The wiring line WL may be located on the first inorganic insulating layer 112. According to some embodiments, the second inorganic insulating layer 113 may cover the wiring line WL. In other words, the wiring line WL may be arranged between the first inorganic insulating layer 112 and the second inorganic insulating layer 113. According to some embodiments, the wiring line WL may be arranged between the second inorganic insulating layer 113 and the third inorganic insulating layer 114.

According to some embodiments, the wiring line WL may include a first wiring line WL1 and a second wiring line WL2, as shown in FIG. 3. The first wiring line WL1 may be arranged between the first inorganic insulating layer 112 and the second inorganic insulating layer 113. The second wiring line WL2 may be arranged between the second inorganic insulating layer 113 and the third inorganic insulating layer 114.

The wiring line WL may be a gate wiring line. According to some embodiments, the first wiring line WL1 may be integrally provided as a single body with at least one of the first gate electrode GE1 or the second gate electrode GE2. According to some embodiments, the second wiring line WL2 may be integrally provided as a single body with the upper electrode Cst2 of the storage capacitor Cst.

The wiring line WL may include a lower layer, an intermediate layer, and an upper layer sequentially stacked. The lower layer may include at least one of Al or an Al alloy. The intermediate layer may include at least one of a niobium titanium aluminum ($Nb_xTi_yAl_z$) alloy or a titanium aluminum ($Ti_xAl_y$) alloy. The upper layer may include a niobium titanium (NbTi) alloy.

When the wiring line WL includes Mo, the wiring line WL needs to be thick in order to reduce the resistance of the wiring line WL. However, in this case, a thickness of the wiring line WL may not be sufficiently maintained due to stress acting on the wiring line WL. According to some embodiments, because the wiring line WL includes at least one of Al or an Al alloy, the wiring line WL may have a low resistance even when the the thickness of the wiring line WL is not sufficiently maintained.

The organic insulating layer 115 may include an organic material. The organic insulating layer 115 may include an organic insulating material, such as a general-purpose polymer (e.g., poly(methyl methacrylate) (PMMA) or polystyrene (PS)), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blends thereof.

The display element layer 20 may be arranged on the pixel circuit layer 11. The display element layer 20 may include an organic light-emitting diode OLED, which is a display element, and a pixel-defining layer 240. The organic light-emitting diode OLED may emit, for example, red, green, or blue light, or may emit red, green, blue, or white light. According to some embodiments, the organic light-emitting diode OLED as a display element may be located on the second inorganic insulating layer 113. The organic light-emitting diode OLED may include a pixel electrode 210, an emission layer 220, and an opposite electrode 230.

The pixel electrode 210 may be located on the organic insulating layer 115. The pixel electrode 210 may be electrically connected to a thin-film transistor TFT through a contact hole of the organic insulating layer 115. The pixel electrode 210 may include a conductive oxide, such as indium tin oxide (ITO), indium zinc oxide (IZO), ZnO, indium oxide ($In_2O_3$), indium gallium oxide (IGO), or aluminum zinc oxide (AZO). According to some embodiments, the pixel electrode 210 may a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the pixel electrode 210 may further include a layer including ITO, IZO, ZnO, or $In_2O_3$ above/under the reflective layer.

The pixel-defining layer 240 having an opening 2400P exposing a central portion of the pixel electrode 210 may be located on the pixel electrode 210. The pixel-defining layer 240 may include an organic insulating material and/or an inorganic insulating material. The opening 2400P may define an emission area EA of light emitted from the organic light-emitting diode OLED. For example, the width of the opening 2400P may correspond to the width of the emission area EA.

The emission layer 220 may be arranged in the opening 2400P of the pixel-defining layer 240. The emission layer 220 may include a high molecular weight or low molecular weight organic material that emits light of a certain color. According to some embodiments, a first functional layer and a second functional layer may be located below and above the emission layer 220, respectively. The first functional layer may include, for example, a hole transport layer (HTL) or an HTL and a hole injection layer (HIL). The second functional layer is a component located on the emission layer 220 and is optional. The second functional layer may include an electron transport layer (ETL) and/or an electron injection layer (EIL). The first functional layer and/or the second functional layer may be a common layer formed to completely cover the substrate 10, like the opposite electrode 230 to be described later.

The opposite electrode 230 may be located on the emission layer 220. The opposite electrode 230 may include a conductive material having a low work function. For example, the opposite electrode 230 may include a (semi) transparent layer including Ag, Mg, Al, Pt, Pd, Au, Ni, Nd, Ir, Cr, lithium (Li), calcium (Ca), or an alloy thereof. Alternatively, the opposite electrode 230 may further include a layer including ITO, IZO, ZnO, or $In_2O_3$ on the (semi)transparent layer including the material described above.

According to some embodiments, an encapsulation layer may be located on the display element layer 20. The encapsulation layer may include at least one inorganic encapsulation layer and at least one organic encapsulation layer, which cover the display element layer 20. According to some embodiments, the at least one inorganic encapsulation layer and the at least one organic encapsulation layer may be alternately stacked. The inorganic encapsulation layer may include one or more inorganic materials selected from among $Al_2O_3$, $TiO_2$, $Ta_2O_5$, ZnO, $SiO_2$, $SiN_x$, and SiON. The organic encapsulation layer may include a polymer-based material. The polymer-based material may include acrylic resin, epoxy-based resin, polyimide, polyethylene, or the like. According to some embodiments, the organic encapsulation layer may include an acrylate.

According to some embodiments, a sealing substrate may be located on the display element layer 20. The sealing substrate may seal the display element layer 20 together with a sealing member arranged in the non-display area. According to some embodiments, the encapsulation layer and the sealing substrate may be simultaneously or concurrently formed on the display element layer 20.

A touch sensor layer may be located on the encapsulation layer. The touch sensor layer may acquire coordinate information according to an external input, for example, a touch event.

An anti-reflection layer may be located on the touch sensor layer. The anti-reflection layer may reduce the reflectance of light incident toward the display device 1. According to some embodiments, the anti-reflection layer may include a retarder and/or a polarizer. The retarder may be of a film type or a liquid crystal coating type, and may include a λ/2 retarder and/or a λ/4 retarder. The polarizer may also be of a film type or a liquid crystal coating type. The film type may include a stretched synthetic resin film, and the liquid crystal coating type may include liquid crystals arranged in a certain arrangement. The retarder and the polarizer may each further include a protective film.

According to some embodiments, the anti-reflection layer may include a black matrix and color filters. The color filters may be arranged considering the color of light emitted from each of the plurality of display elements of the display device 1. Each of the color filters may include a red, green, or blue pigment or dye. Alternatively, each of the color filters may further include quantum dots in addition to the aforementioned pigments or dyes. Alternatively, some of the color filters may not include the aforementioned pigment or dye, and may include scattering particles, such as titanium oxide.

According to some embodiments, the anti-reflection layer may include a destructive interference structure. The destructive interference structure may include a first reflective layer and a second reflective layer, which are located on different layers. First reflected light and second reflected light respectively reflected from the first reflective layer and the second reflective layer may destructively interfere with each other, and thus, the reflectance of external light may be reduced.

Figure 4:
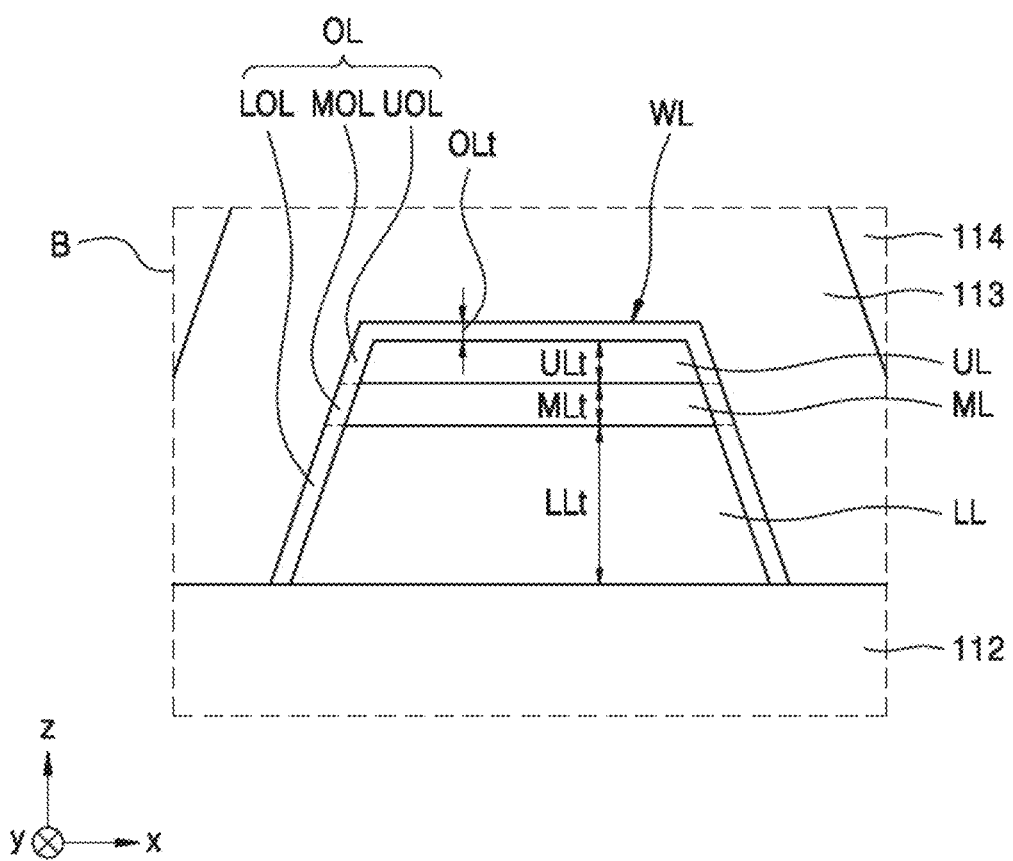
FIG. 4 is an enlarged view of a region B of the display device according to some embodiments.

FIG. 4 is an enlarged view of a region B of the display device 1 of FIG. 3. In FIG. 4, the same reference numerals as those in FIG. 3 denote the same members as those in FIG. 3, and thus, redundant descriptions thereof are omitted.

Referring to FIG. 4, the display device 1 may include a first inorganic insulating layer 112, a wiring line WL, a second inorganic insulating layer 113, a third inorganic insulating layer 114, and a display element.

The wiring line WL may be located on the first inorganic insulating layer 112. According to some embodiments, the wiring line WL may be located directly on the first inorganic insulating layer 112. In other words, a component may not be arranged between the wiring line WL and the first inorganic insulating layer 112.

The wiring line WL may include a lower layer LL, an intermediate layer ML, and an upper layer UL. The wiring line WL may further include an oxide layer OL. According to some embodiments, the lower layer LL, the intermediate layer ML, and the upper layer UL may each be provided in plurality. For example, the wiring line WL may further include an additional lower layer including the same material as the lower layer LL, an additional intermediate layer including the same material as the intermediate layer ML, and an additional upper layer including the same material as the upper layer UL. In this case, the lower layer LL, the intermediate layer ML, the upper layer UL, the additional lower layer, the additional intermediate layer, and the additional upper layer may be sequentially stacked. In some embodiments, the wiring line WL may be a wiring line in which the stacked structure described above is repeatedly arranged.

The wiring line WL may be a heat-treated wiring line. The heat treatment may be performed at a high temperature. According to some embodiments, the heat treatment may be performed at about 350° C. to about 500° C. The intermediate layer ML and the oxide layer OL may be formed when the lower layer LL and the upper layer UL are heat-treated.

The lower layer LL may be located on the first inorganic insulating layer 112. The lower layer LL may include at least one of Al or an Al alloy. The Al alloy may include at least one of Ni, lanthanum (La), Nd, or germanium (Ge). According to some embodiments, the amount of at least one of Ni, La, Nd, or Ge may not exceed 2 at % in the Al alloy. For example, the amount of at least one of Ni, La, Nd, or Ge may be in the range of about 0.01 at % to about 2 at % in the Al alloy. For example, in the Al alloy, the amount of Ni may be in the range of about 0.01 at % to about 0.05 at %, and the amount of La may be in the range of about 0.01 at % to about 0.1 at %. According to some embodiments, each of the amount of Ni and the amount of La in the Al alloy may not exceed 0.1 at %. According to some embodiments, the sum of the amount of Ni and the amount of La in the Al alloy may not exceed 0.15 at %. When the Al alloy satisfies the above conditions, the wiring line WL may have a low resistance.

A thickness LLt of the lower layer LL may be greater than a thickness ULt of the upper layer UL. The thickness LLt of the lower layer LL may be greater than a thickness MLt of the intermediate layer ML. The thickness LLt of the lower layer LL may be greater than the sum of the thicknesses of the intermediate layer ML and the upper layer UL.

The upper layer UL may be located on the lower layer LL. The upper layer UL may be located on the intermediate layer ML. The upper layer UL may include a niobium titanium ($Nb_xTi_y$) alloy. In $Nb_xTi_y$, each of x and y values may be positive.

According to some embodiments, the thickness ULt of the upper layer UL may be in the range of about 30 Å to about 1000 Å. When the thickness ULt of the upper layer UL is less than 30 Å, a capping effect for a hillock defect of the lower layer LL may not be achieved. When the thickness ULt of the upper layer UL exceeds 1000 Å, the resistance of the wiring line WL may increase and electrical characteristics may deteriorate. As the thickness ULt of the upper layer UL is relatively small, the resistance of the wiring line WL may decrease and electrical characteristics may be improved. Therefore, according to some embodiments, the thickness ULt of the upper layer UL may be in the range of about 30 Å to about 400 Å.

In a subsequent process after forming the wiring line WL, for example, in a cleaning process or an etching process of forming a contact hole for connecting the wiring line WL to another conductive layer, the wiring line WL may be damaged by a cleaning solution, an etchant, or the like. The cleaning solution or the etchant may include, for example, hydrogen fluoride (HF). According to some embodiments, because the upper layer UL includes an $Nb_xTi_y$ alloy, damage to the wiring line WL due to a cleaning solution or an etchant may be prevented. When the upper layer UL includes a titanium (Ti) layer, the wiring line WL may be damaged by a cleaning solution or an etchant in the subsequent process.

According to some embodiments, the amount of Ti in the upper layer UL may be in the range of 5 at % or more and 50 at % or less. According to some embodiments, the amount of Ti in the upper layer UL may be in the range of 5 at % or more and 20 at % or less. When the amount of Ti in the upper layer UL is less than 5 at %, the effect of preventing or reducing thermal corrosion of the wiring line WL by forming the intermediate layer ML may be reduced. When the amount of Ti in the upper layer UL exceeds 50 at %, the damage of the wiring line WL by the cleaning solution or the etchant may be relatively large. When the amount of Ti in the upper layer UL exceeds 50 at %, electrical reliability of the wiring line WL may deteriorate. As the amount of Ti in the upper layer UL decreases, the degree of damage to the upper layer UL by the cleaning solution or etchant may be reduced. In addition, when the amount of Ti is 20 at % or less, the etch rate is less than 1 Å/sec, and thus, the amount of Ti may preferably be in the range of 5 at % or more and 20 at % or less.

The intermediate layer ML may be a layer formed by inter-diffusion between the lower layer LL and the upper layer UL. For example, the intermediate layer ML may include an $Nb_xTi_yAl_z$ alloy formed as Al of the lower layer LL and $Nb_xTi_y$ of the upper layer UL are inter-diffused. According to some embodiments, $Nb_xTi_yAl_z$ may be NbTiAl. According to some embodiments, each of the x, y, and z values in $Nb_xTi_yAl_z$ may be positive. The intermediate layer ML may be a layer formed when the lower layer LL and the upper layer UL are heat-treated.

The intermediate layer ML may be arranged between the lower layer LL and the upper layer UL. The thickness MLt of the intermediate layer ML may be proportional to the thickness ULt of the upper layer UL. The thickness MLt of the intermediate layer ML may be a distance between the lower surface of the intermediate layer ML facing the upper surface of the lower layer LL and the upper surface of the intermediate layer ML facing the lower surface of the upper layer UL. According to some embodiments, when the thickness ULt of the upper layer UL is 50 Å, the thickness MLt of the intermediate layer ML may be 100 nm or less. According to some embodiments, when the thickness ULt of the upper layer UL is 100 Å, the thickness MLt of the intermediate layer ML may be 150 nm or less. According to some embodiments, when the thickness ULt of the upper layer UL is 200 Å, the thickness MLt of the intermediate layer ML may be 200 nm or less. According to some embodiments, when the thickness ULt of the upper layer UL is 300 Å, the thickness MLt of the intermediate layer ML may be 200 nm or more.

The intermediate layer ML may be a layer capable of preventing or reducing thermal corrosion of the wiring line WL, as described with reference to FIG. 7. The intermediate layer ML may be a layer capable of preventing or reducing thermal corrosion of the lower layer LL. In order to form the precise wiring line WL, the lower layer LL and the upper layer UL may be formed using dry etching. In this case, a gas containing chlorine gas may be supplied, and after a dry etching process is completed, at least one of chlorine (Cl) or Cl radicals may be located on the side surface of the lower layer LL and the side surface of the upper layer UL. At least one of Cl or Cl radicals may cause defects in the wiring line WL in a subsequent process of maintaining a high temperature after forming the wiring line WL, for example, in a process of forming an insulating layer. According to some embodiments, an intermediate layer ML including an $Nb_xTi_yAl_z$ alloy may be arranged between the lower layer LL and the upper layer UL. In this case, after the dry etching process is completed, the occurrence of defects in the wiring line WL by at least one of Cl or Cl radicals located on the side surface of the lower layer LL and the side surface of the upper layer UL may be prevented or reduced. In other words, the intermediate layer ML may prevent or reduce thermal corrosion of the wiring line WL.

When the upper layer UL includes TiN, even when the lower layer LL and the upper layer UL are heat-treated, inter-diffusion may not occur between the lower layer LL and the upper layer UL, and the intermediate layer ML may not be formed. In this case, thermal corrosion of the wiring line WL may not be prevented or reduced. According to some embodiments, when the wiring line WL is formed, the upper layer UL may include an $Nb_xTi_y$ alloy. Accordingly, inter-diffusion may occur between the lower layer LL and the upper layer UL, and thus, the intermediate layer ML may be formed. Accordingly, according to some embodiments, thermal corrosion of the wiring line WL may be prevented or reduced.

The oxide layer OL may include a lower oxide layer LOL, an intermediate oxide layer MOL, and an upper oxide layer UOL. The oxide layer OL may be located on the side surface of the lower layer LL, the side surface of the intermediate layer ML, and the side surface and the upper surface of the upper layer UL. The oxide layer OL may be arranged to cover the side surface of each of the lower layer LL, the intermediate layer ML, and the upper layer UL and at least a portion of the upper surface of the upper layer UL. According to some embodiments, a thickness OLt of the oxide layer OL may be in the range of about 10 nm to about 40 nm. The thickness OLt of the oxide layer OL may be 10 nm or more by a heat treatment process step for forming the intermediate layer ML.

The lower oxide layer LOL may be located on the side surface of the lower layer LL. According to some embodiments, the lower oxide layer LOL may surround the outer surface of the lower layer LL. According to some embodiments, the lower oxide layer LOL may include aluminum oxide.

The intermediate oxide layer MOL may be located on the side surface of the intermediate layer ML. According to some embodiments, the intermediate oxide layer MOL may surround the outer surface of the intermediate layer ML.

According to some embodiments, the intermediate oxide layer MOL may include at least one of titanium oxide, aluminum oxide, niobium oxide, or niobium titanium aluminum oxide.

The upper oxide layer UOL may be located on the side surface and upper surface of the upper layer UL. According to some embodiments, the upper oxide layer UOL may surround the outer surface of the upper layer UL. According to some embodiments, the upper oxide layer UOL may include niobium titanium oxide.

The second inorganic insulating layer 113 may cover the wiring line WL. The second inorganic insulating layer 113 may extend along the shape of the wiring line WL. The third inorganic insulating layer 114 may be located on the second inorganic insulating layer 113. The third inorganic insulating layer 114 may extend along the shape of the second inorganic insulating layer 113.

Figure 5:
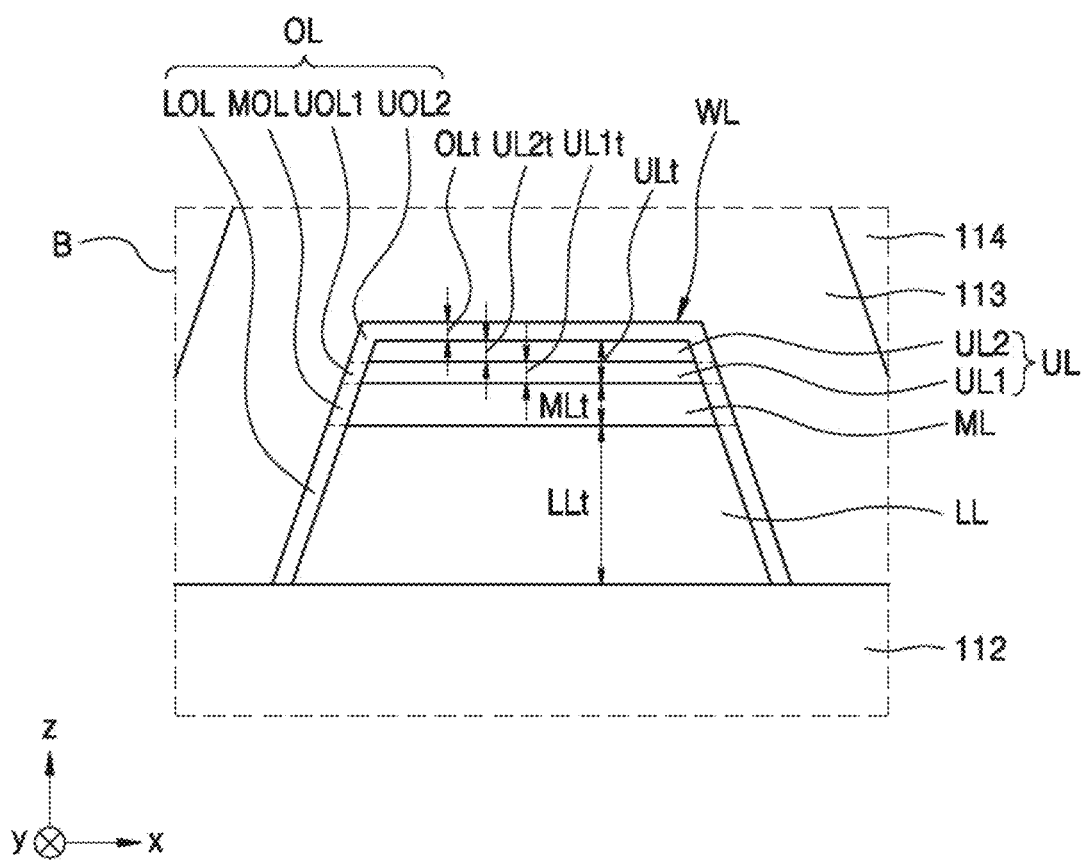
FIG. 5 is an enlarged view of a region B of a display device according to some embodiments.

FIG. 5 illustrates another example of a region corresponding to an enlarged region B of the display device 1 of FIG. 3. In FIG. 5, the same reference numerals as those in FIGS. 3 and 4 denote the same members as those in FIGS. 3 and 4, and thus, redundant descriptions thereof are omitted.

Referring to FIG. 5, the wiring line WL may include a lower layer LL, an upper layer UL, and an intermediate layer ML arranged between the lower layer LL and the upper layer UL. The wiring line WL may further include an oxide layer OL.

The upper layer UL may be located on the lower layer LL. The upper layer UL may be located on the intermediate layer ML. The upper layer UL may include an $Nb_xTi_y$ alloy. In $Nb_xTi_y$, each of x and y values may be positive. The upper layer UL may include a first upper layer UL1 and a second upper layer UL2 on the first upper layer UL1. A thickness ULt of the upper layer UL may be in the range of about 60 Å to about 1500 Å.

The first upper layer UL1 may be located on the intermediate layer ML. The first upper layer UL1 may be arranged between the intermediate layer ML and the second upper layer UL2. The first upper layer UL1 may be a layer adjacent to the intermediate layer ML. The first upper layer UL1 may be located closer to the lower layer LL than the second upper layer UL2. The first upper layer UL1 may include Ti. The first upper layer UL may be a titanium (Ti) layer. A thickness UL1t of the first upper layer UL1 may be less than a thickness UL2t of the second upper layer UL2, but is not limited thereto. For example, the thickness UL1t of the first upper layer UL1 may be substantially equal to or greater than the thickness UL2t of the second upper layer UL2. According to some embodiments, the thickness UL1t of the first upper layer UL1 may be in the range of about 30 Å to about 400 Å. According to some embodiments, because the first upper layer UL1 is included in the upper layer UL, the effect of preventing or reducing thermal corrosion of the wiring line WL may increase.

The second upper layer UL2 may be located on the first upper layer UL1. The second upper layer UL2 may be located farther from the lower layer LL than the first upper layer UL1. The second upper layer UL2 may include an $Nb_xTi_y$ alloy. In $Nb_xTi_y$, each of x and y values may be positive. A thickness ULt2 of the second upper layer UL2 may be greater than a thickness ULt1 of the first upper layer UL1, but is not limited thereto. For example, the thickness ULt2 of the second upper layer UL2 may be substantially equal to or less than the thickness ULt1 of the first upper layer UL1. According to some embodiments, the thickness UL2t of the second upper layer UL2 may be in the range of about 30 Å to about 1000 Å. According to some embodiments, the thickness UL2t of the second upper layer UL2 may be in the range of about 30 Å to about 400 Å.

According to some embodiments, the amount of Ti in the second upper layer UL2 may be in the range of 5 at % or more and 50 at % or less. According to some embodiments, the amount of Ti in the second upper layer UL2 may be in the range of 5 at % or more and 20 at % or less. When the amount of Ti in the second upper layer UL2 is less than 5 at %, the effect of preventing or reducing thermal corrosion of the wiring line WL by forming the intermediate layer ML may be reduced. When the amount of Ti in the second upper layer UL2 exceeds 50 at %, the damage of the wiring line WL by the etchant may be relatively large. When the amount of Ti in the second upper layer UL2 exceeds 50 at %, electrical reliability of the wiring line WL may deteriorate. As described with reference to FIGS. 8 and 9, as the amount of Ti in the second upper layer UL2 decreases, the degree of etching of the second upper layer UL2 by the etchant may decrease, and thus, the amount of Ti may preferably be in the range of 5 at % or more and 20 at % or less.

The intermediate layer ML may be a layer formed by inter-diffusion of the upper layer UL and the lower layer LL. According to some embodiments, the intermediate layer ML may be a layer formed by inter-diffusion of the first upper layer UL1 and the lower layer LL. For example, the intermediate layer ML may include a $Ti_xAl_y$ alloy formed as Ti of the first upper layer UL1 and Al of the lower layer LL are inter-diffused. According to some embodiments, the intermediate layer ML may be a layer formed by inter-diffusion of the first upper layer UL1, the second upper layer UL2, and the lower layer LL. For example, the intermediate layer ML may include an $Nb_xTi_yAl_z$ alloy and a $Ti_xAl_y$ alloy, which are formed as Ti of the first upper layer UL1, NbTi of the second upper layer UL2, and Al of the lower layer LL are inter-diffused. The intermediate layer ML may be a layer formed when the lower layer LL and the upper layer UL are heat-treated. Depending on the thickness of the first upper layer UL1 and the degree of inter-diffusion, the intermediate layer ML may include at least a $Ti_xAl_y$ alloy and may or may not include an $Nb_xTi_yAl_z$ alloy.

The intermediate layer ML may be a layer capable of preventing or reducing thermal corrosion of the wiring line WL. The intermediate layer ML may be a layer capable of preventing or reducing thermal corrosion of the lower layer LL. According to some embodiments, by arranging an intermediate layer ML including a titanium aluminum alloy and/or a niobium titanium aluminum alloy between the lower layer LL and the upper layer UL, thermal corrosion may be prevented or reduced.

The intermediate layer ML may be arranged between the upper layer UL and the lower layer LL. The intermediate layer ML may be arranged between the first upper layer UL1 and the lower layer LL.

The oxide layer OL may include a lower oxide layer LOL, an intermediate oxide layer MOL, a first upper oxide layer UOL1, and a second upper oxide layer UOL2. The oxide layer OL may be located on the side surface of the lower layer LL, the side surface of the intermediate layer ML, and the side surface and the upper surface of the upper layer UL. The oxide layer OL may be arranged to cover the side surface of each of the lower layer LL, the intermediate layer ML, the first upper layer UL1, and the second upper layer UL2 and at least a portion of the upper surface of the second upper layer UL2. According to some embodiments, a thickness OLt of the oxide layer OL may be in the range of about 10 nm to about 40 nm.

The lower oxide layer LOL may be located on the side surface of the lower layer LL. According to some embodiments, the lower oxide layer LOL may surround the outer surface of the lower layer LL. According to some embodiments, the lower oxide layer LOL may include aluminum oxide.

The intermediate oxide layer MOL may be located on the side surface of the intermediate layer ML. According to some embodiments, the intermediate oxide layer MOL may surround the outer surface of the intermediate layer ML. According to some embodiments, the intermediate oxide layer MOL may include at least one of titanium oxide, aluminum oxide, niobium oxide, titanium aluminum oxide, or niobium titanium aluminum oxide.

The first upper oxide layer UOL1 may be located on the side surface of the first upper layer UL1. According to some embodiments, the first upper oxide layer UOL1 may surround the outer surface of the first upper layer UL1. According to some embodiments, the first upper oxide layer UOL1 may include titanium oxide.

The second upper oxide layer UOL2 may be located on the side surface and upper surface of the second upper layer UL2. According to some embodiments, the second upper oxide layer UOL2 may surround the outer surface of the second upper layer UL2. According to some embodiments, the second upper oxide layer UOL2 may include niobium titanium oxide.

FIGS. 6A to 6E are schematic cross-sectional views illustrating a method of manufacturing a display device, according to some embodiments. FIGS. 6A to 6E schematically illustrate a method of manufacturing a display device according to an enlarged region B of the display device 1 of FIG. 3. In FIGS. 6A to 6E, the same reference numerals as those in FIG. 4 denote the same members as those in FIG. 4, and thus, redundant descriptions thereof are omitted.

Figure 6A:
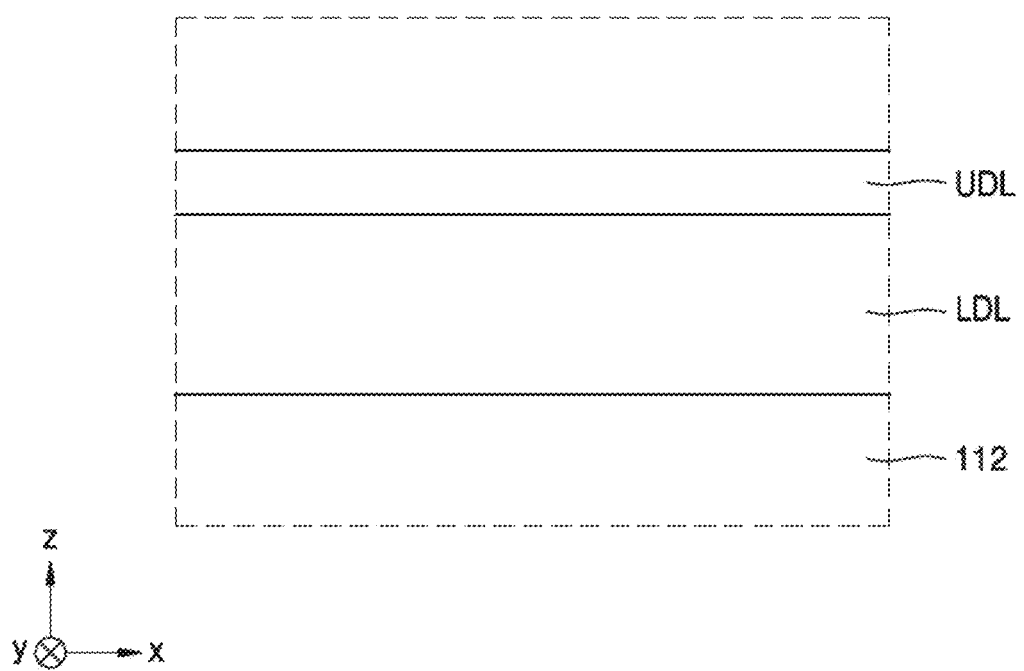
FIGS. 6A to 6E are schematic cross-sectional views illustrating a method of manufacturing a display device, according to an embodiment.

Referring to FIG. 6A, a lower conductive layer LDL and an upper conductive layer UDL, located on a first inorganic insulating layer 112, may be prepared.

The lower conductive layer LDL may be located on the first inorganic insulating layer 112. The lower conductive layer LDL may include at least one of Al or an Al alloy. The Al alloy may include at least one of Ni, La, Nd, or Ge. According to some embodiments, the amount of at least one of Ni, La, Nd, or Ge may not exceed 2 at % in the Al alloy. According to some embodiments, the amount of Ni may be about 0.01 at % to about 0.05 at % in the Al alloy, and the amount of La may be about 0.01 at % to about 0.1 at % in the Al alloy. According to some embodiments, each of the amount of Ni and the amount of La may not exceed 0.1 at % in the Al alloy.

The upper conductive layer UDL may be located on the lower conductive layer LDL. The upper conductive layer UDL may include $Nb_xTi_y$. According to some embodiments, the amount of Ti in the upper conductive layer UDL may be in the range of 5 at % or more and 50 at % or less. According to some embodiments, the amount of Ti in the upper conductive layer UDL may be in the range of 5 at % or more and 20 at % or less. When the amount of Ti in the upper conductive layer UDL is less than 5 at %, the effect of preventing or reducing thermal corrosion of the wiring line WL may be reduced. When the amount of Ti in the upper conductive layer UDL exceeds 50 at %, the damage of the wiring line WL by the etchant may be relatively large. When the amount of Ti in the upper conductive layer UDL exceeds 50 at %, electrical reliability of the wiring line WL may deteriorate.

According to some embodiments, the upper conductive layer UDL may include a plurality of layers, and may further include a layer including $Nb_xTi_y$ and a titanium (Ti) layer between the layer including $Nb_xTi_y$ and the lower conductive layer LDL. In this case, the embodiments of FIG. 5 may be formed by a subsequent process.

Figure 6B:
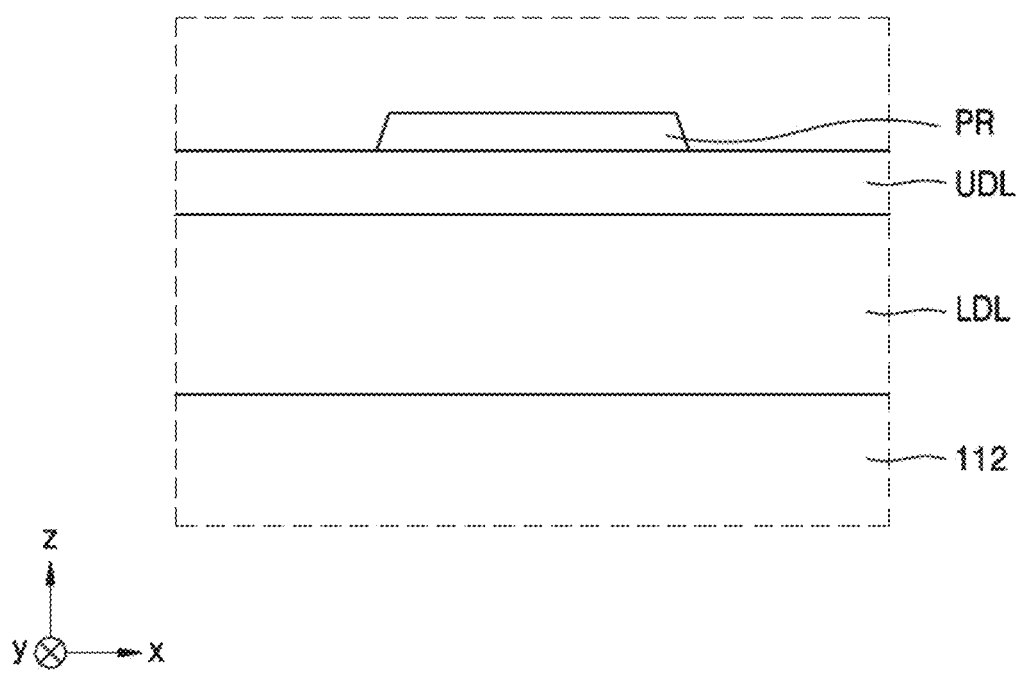
Figure 6C:
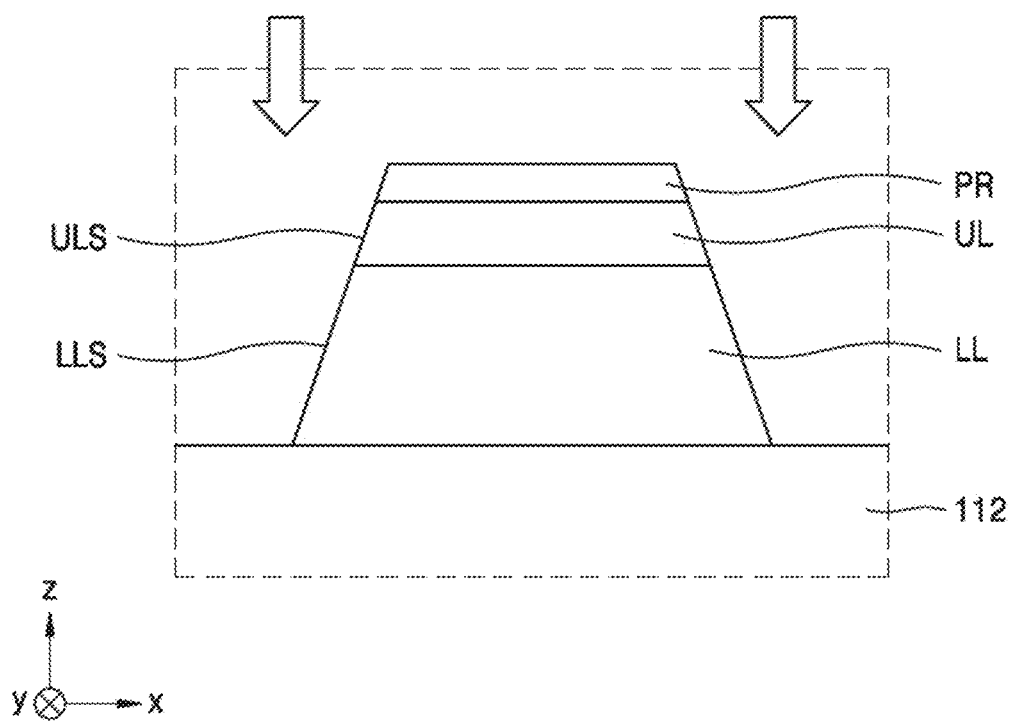
Figure 6D:
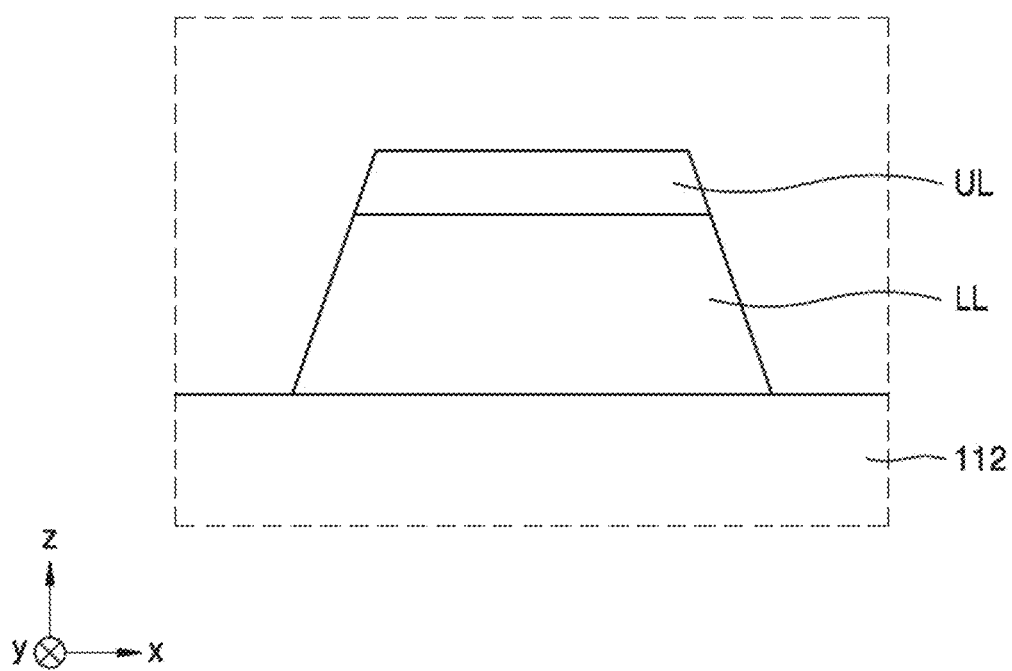

Referring to FIGS. 6B to 6D, a portion of the lower conductive layer LDL and a portion of the upper conductive layer UDL may be etched. According to some embodiments, a portion of the lower conductive layer LDL and a portion of the upper conductive layer UDL may be dry etched. Accordingly, a lower layer LL and an upper layer UL may be provided.

Referring to FIGS. 6B and 6C, a photoresist pattern PR may be formed on the upper conductive layer UDL. According to some embodiments, the photoresist pattern PR may include an organic insulator.

A portion of the lower conductive layer LDL and a portion of the upper conductive layer UDL may be dry-etched using the photoresist pattern PR as a mask. According to some embodiments, a portion of the lower conductive layer LDL and a portion of the upper conductive layer UDL, which do not overlap the photoresist pattern PR, may be dry-etched. Other portions of the lower conductive layer LDL and other portions of the upper conductive layer UDL, which overlap the photoresist pattern PR, may not be dry-etched. Accordingly, the lower layer LL and the upper layer UL on the lower layer LL may be provided. Another portion of the lower conductive layer LDL may be the lower layer LL. Another portion of the upper conductive layer UDL may be the upper layer UL.

When the lower conductive layer LDL and the upper conductive layer UDL are dry-etched, a gas may be supplied. According to some embodiments, the gas may include at least one of chlorine ($Cl_2$), boron trichloride ($BCl_3$), or nitrogen ($N_2$). Accordingly, after a portion of the lower conductive layer LDL and a portion of the upper conductive layer UDL are dry-etched, at least one of Cl or Cl radicals may remain on a side surface LLS of the lower layer LL and a side surface ULS of the upper layer UL.

Referring to FIG. 6D, the photoresist pattern PR may be removed. The photoresist pattern PR may be removed by a strip process.

Figure 6E:
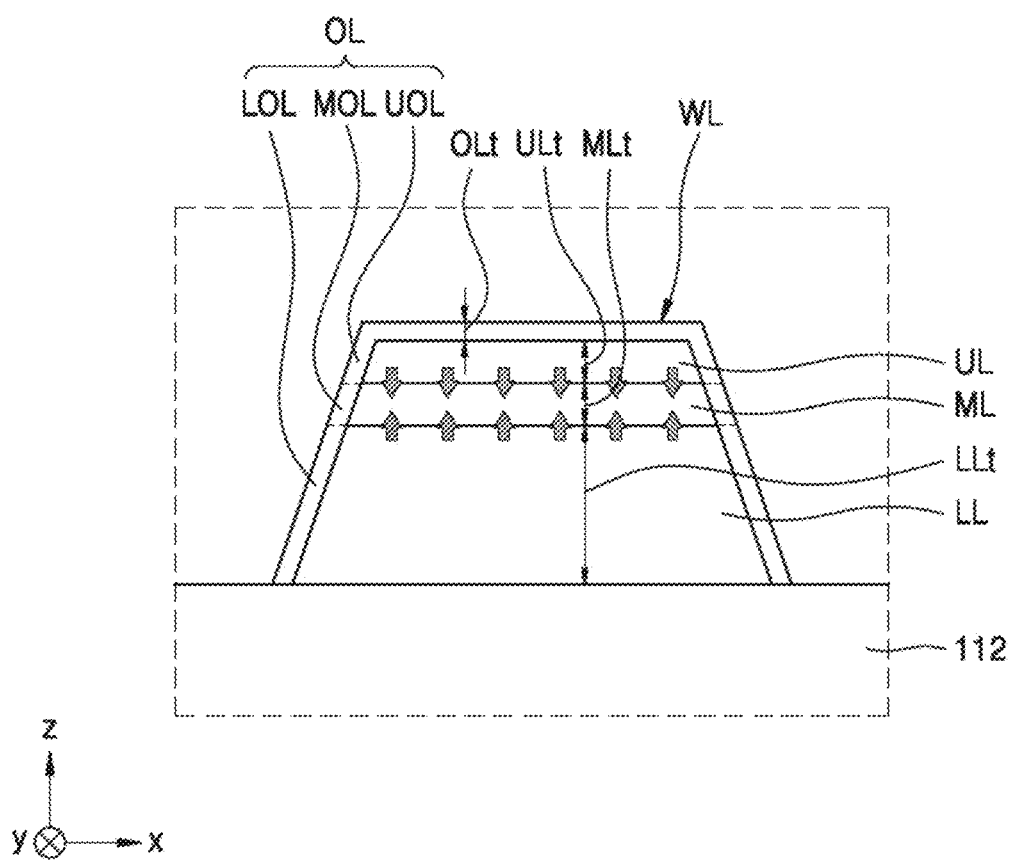

Referring to FIG. 6E, the lower layer LL and the upper layer UL may be heat-treated. The heat treatment may be performed at a high temperature. According to some embodiments, the heat treatment may be performed at about 350° C. to about 500° C. When the heat treatment is performed outside the range of about 350° C. to about 500° C., an intermediate layer ML may not be smoothly formed. According to some embodiments, a time for which the heat treatment is performed may be about 30 minutes. According to some embodiments, the time for which the heat treatment is performed may be less than 30 minutes or greater than 30 minutes.

Inter-diffusion may occur between the lower layer LL and the upper layer UL. According to some embodiments, a first metal atom included in the lower layer LL may diffuse into the upper layer UL, and a second metal atom included in the upper layer UL may diffuse into the lower layer LL. The first metal atom may be an Al atom. The second metal atom may be a Ti atom and/or an Nb atom.

According to some embodiments, a thickness ULt of the upper layer UL may be in the range of about 30 Å to about 1000 Å. When the thickness ULt of the upper layer UL is less than 30 Å, a capping effect for a hillock defect of the lower layer LL may not be achieved. When the thickness ULt of the upper layer UL exceeds 1000 Å, the resistance of the wiring line WL may increase and electrical characteristics may deteriorate. As the thickness ULt of the upper layer UL is relatively small, the resistance of the wiring line WL may decrease and electrical characteristics may be improved. Therefore, according to some embodiments, the thickness ULt of the upper layer UL may be formed in the range of about 30 Å to about 400 Å.

The intermediate layer ML may be formed between the lower layer LL and the upper layer UL. The intermediate layer ML may be a layer formed by inter-diffusion between the lower layer LL and the upper layer UL. The intermediate layer ML may include an $Nb_xTi_yAl_z$ alloy. According to some embodiments, $Nb_xTi_yAl_z$ may be NbTiAl. According to some embodiments, each of the x, y, and z values in $Nb_xTi_yAl_z$ may be positive. According to some embodiments, when the upper conductive layer UDL described with reference to FIG. 6A includes a plurality of layers further including a titanium (Ti) layer, the intermediate layer ML may include a $Ti_xAl_y$ alloy. According to some embodiments, the intermediate layer ML may include a $Ti_xAl_y$ alloy and an $Nb_xTi_yAl_z$ alloy.

A thickness MLt of the intermediate layer ML may be proportional to the thickness ULt of the upper layer UL. The thickness MLt of the intermediate layer ML may be a distance between the lower surface of the intermediate layer ML facing the upper surface of the lower layer LL and the upper surface of the intermediate layer ML facing the lower surface of the upper layer UL. According to some embodiments, when the thickness ULt of the upper layer UL is 50 Å, the thickness MLt of the intermediate layer ML may be 100 nm or less. According to some embodiments, when the thickness ULt of the upper layer UL is 100 Å, the thickness MLt of the intermediate layer ML may be 150 nm or less. According to some embodiments, when the thickness ULt of the upper layer UL is 200 Å, the thickness MLt of the intermediate layer ML may be 200 nm or less. According to some embodiments, when the thickness ULt of the upper layer UL is 300 Å, the thickness MLt of the intermediate layer ML may be 200 nm or more.

When the intermediate layer ML is formed, an oxide layer OL may be formed. The oxide layer OL may include a lower oxide layer LOL, an intermediate oxide layer MOL, and an upper oxide layer UOL. The oxide layer OL may be formed on the side surface of the lower layer LL, the side surface of the intermediate layer ML, and the side surface and the upper surface of the upper layer UL. The oxide layer OL may be formed to cover the side surface of each of the lower layer LL, the intermediate layer ML, and the upper layer UL and at least a portion of the upper surface of the upper layer UL. According to some embodiments, a thickness OLt of the oxide layer OL may be in the range of about 10 nm to about 40 nm.

The lower oxide layer LOL may be formed on the side surface of the lower layer LL. According to some embodiments, the lower oxide layer LOL may surround the outer surface of the lower layer LL. According to some embodiments, the lower oxide layer LOL may include aluminum oxide.

The intermediate oxide layer MOL may be formed on the side surface of the intermediate layer ML. According to some embodiments, the intermediate oxide layer MOL may surround the outer surface of the intermediate layer ML. According to some embodiments, the intermediate oxide layer MOL may include at least one of titanium oxide, aluminum oxide, niobium oxide, or niobium titanium aluminum oxide.

The upper oxide layer UOL may be formed on the side surface and upper surface of the upper layer UL. According to some embodiments, the upper oxide layer UOL may surround the outer surface of the upper layer UL. According to some embodiments, the upper oxide layer UOL may include niobium titanium oxide.

Referring back to FIG. 5, a second inorganic insulating layer 113 covering the wiring line WL may be formed. Also, a third inorganic insulating layer 114 may be formed on the second inorganic insulating layer 113. According to some embodiments, the second inorganic insulating layer 113 may cover the lower layer LL, the intermediate layer ML, and the upper layer UL. The second inorganic insulating layer 113 may extend along the shape of the outer surface of the wiring line WL.

FIG. 7 is a table showing that a wiring line is corroded by heat depending on the material of a lower layer, the material of an upper layer, and whether or not heat treatment is performed.

Referring to FIG. 7, CASE I, CASE II, and CASE III are shown. The heat treatment was carried out at a temperature of about 350° C. to about 500° C.

CASE I is a case in which the lower layer includes Al, the upper layer includes NbTi, and no heat treatment is performed. In CASE I, thermal corrosion occurred in the wiring line.

CASE II is a case in which the lower layer includes Al, the upper layer includes TiN, and heat treatment is performed. In CASE II, thermal corrosion occurred in the wiring line. That is, when inter-diffusion does not occur between the lower layer and the upper layer even after heat treatment as in CASE II, thermal corrosion may occur in the wiring line.

CASE III is a case in which the lower layer includes Al, the upper layer includes NbTi, and heat treatment is performed. In CASE III, no thermal corrosion occurred in the wiring line. That is, when an intermediate layer including an $Nb_xTi_yAl_z$ alloy is formed by heat treatment, defects due to heat in the wiring line may be reduced.

A wiring line of a display device according to some embodiments may include a lower layer including at least one of Al or an Al alloy to have low resistance. The wiring line of the display device according to some embodiments may include an upper layer including an NbTi alloy to prevent or reduce damage caused by a cleaning solution or an etchant. The wiring line of the display device according to some embodiments may include an intermediate layer including at least one of an $Nb_xTi_yAl_z$ alloy or a $Ti_xAl_y$ alloy to prevent or reduce thermal corrosion.

A method of manufacturing a display device according to some embodiments may include forming a lower conductive layer including at least one of Al or an Al alloy and an upper conductive layer including an $Nb_xTi_y$ alloy on the lower conductive layer, etching a portion of the lower conductive layer and a portion of the upper conductive layer to provide a lower layer and an upper layer, and heat-treating the lower layer and the upper layer to form an intermediate layer including at least one of an $Nb_xTi_yAl_z$ alloy or a $Ti_xAl_y$ alloy. Accordingly, the wiring line of the display device manufactured by the method of manufacturing a display device according to some embodiments may have a low resistance, prevent or reduce thermal corrosion, and prevent or reduce damage caused by an etchant or a cleaning solution. However, the scope of embodiments according to the present disclosure are not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
a wiring line on a first inorganic insulating layer;
a second inorganic insulating layer covering the wiring line; and
a display element on the second inorganic insulating layer,
wherein the wiring line comprises:
a lower layer including at least one of aluminum (Al) or an aluminum (Al) alloy;
an upper layer on the lower layer and including a niobium titanium ($Nb_xTi_y$) alloy; and
an intermediate layer between the lower layer and the upper layer and including at least one of a niobium titanium aluminum ($Nb_xTi_yAl_z$) alloy or a titanium aluminum ($Ti_xAl_y$) alloy.

2. The display device of claim 1, wherein, in the niobium titanium ($Nb_xTi_y$) alloy of the upper layer, an amount of titanium (Ti) is in a range of 5 at % or more and 50 at % or less.

3. The display device of claim 1, wherein a thickness of the upper layer is in a range of 30 Å or more and 1,000 Å or less.

4. The display device of claim 1, wherein the upper layer includes a first upper layer on the intermediate layer and a second upper layer on the first upper layer,
wherein the first upper layer includes titanium (Ti), and the second upper layer includes a niobium titanium ($Nb_xTi_y$) alloy.

5. The display device of claim 4, wherein the intermediate layer includes a titanium aluminum ($Ti_xAl_y$) alloy.

6. The display device of claim 4, wherein a thickness of the first upper layer is less than a thickness of the second upper layer.

7. The display device of claim 4, wherein a thickness of the second upper layer is in a range of 30 Å or more and 1,000 Å or less.

8. The display device of claim 1, wherein the wiring line further includes an oxide layer on a side surface of the lower layer, a side surface of the intermediate layer, and a side surface and an upper surface of the upper layer.

9. The display device of claim 8, wherein a thickness of the oxide layer is in a range of 10 nm to 40 nm.

10. The display device of claim 1, wherein the aluminum (Al) alloy includes at least one of nickel (Ni), lanthanum (La), neodymium (Nd), or germanium (Ge).

11. The display device of claim 10, wherein, in the aluminum (Al) alloy, an amount of at least one of nickel (Ni), lanthanum (La), neodymium (Nd), or germanium (Ge) is in a range of 0.01 at % to 2 at %.

12. The display device of claim 10, wherein, in the aluminum (Al) alloy, an amount of nickel (Ni) is in a range of 0.01 at % to 0.05 at % and an amount of lanthanum (La) is in a range of 0.01 at % to 0.1 at %.

13. A method of manufacturing a display device, the method comprising:
preparing a lower conductive layer on a first inorganic insulating layer and including at least one of aluminum (Al) or an aluminum (Al) alloy, and an upper conductive layer on the lower conductive layer and including a niobium titanium (NbTi) alloy;
dry-etching a portion of the lower conductive layer and a portion of the upper conductive layer to provide a lower layer and an upper layer on the lower layer; and
forming, between the lower layer and the upper layer, an intermediate layer including at least one of a niobium titanium aluminum ($Nb_xTi_yAl_z$) alloy or a titanium aluminum ($Ti_xAl_y$) alloy by performing a heat treatment of the lower layer and the upper layer.

14. The method of claim 13, wherein the dry-etching of the portion of the lower conductive layer and the portion of the upper conductive layer comprises:
forming a photoresist pattern on the upper conductive layer;
dry-etching the portion of the lower conductive layer and the portion of the upper conductive layer by using the photoresist pattern as a mask; and
removing the photoresist pattern.

15. The method of claim 13, wherein, in the niobium titanium ($Nb_xTi_y$) alloy of the upper layer, an amount of titanium (Ti) is in a range of 5 at % or more and 50 at % or less.

16. The method of claim 13, wherein the upper conductive layer includes a plurality of layers, and includes a layer including a niobium titanium ($Nb_xTi_y$) alloy and a titanium (Ti) layer between the lower conductive layer and the layer including the niobium titanium ($Nb_xTi_y$) alloy, and
the upper layer includes a first upper layer including titanium (Ti) and a second upper layer on the first upper layer and including a niobium titanium ($Nb_xTi_y$) alloy.

17. The method of claim 16, wherein the intermediate layer includes a titanium aluminum ($Ti_xAl_y$) alloy.

18. The method of claim 13, wherein the forming of the intermediate layer comprises generating inter-diffusion between the lower layer and the upper layer.

19. The method of claim 13, wherein the heat treatment is performed at 350° C. to 500° C.

20. The method of claim 13, wherein the forming of the intermediate layer comprises forming an oxide layer covering a side surface of each of the lower layer, the intermediate layer, and the upper layer and at least a portion of an upper surface of the upper layer.

* * * * *